US006912129B2

(12) United States Patent
Baker et al.

(10) Patent No.: US 6,912,129 B2
(45) Date of Patent: Jun. 28, 2005

(54) CHASSIS COOLING SYSTEM (75) Inventors: David A. Baker, Hillsboro, OR (US);
Kevin W. Bross, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 55 days.

(21) Appl. No.: 10/659,214

(22) Filed: Sep. 10, 2003

(65) Prior Publication Data

US 2005/0052843 A1 Mar. 10, 2005

(51) Int. Cl.[7] ................................ H05H 7/20
(52) U.S. Cl. ............... 361/695; 165/80.3; 454/184
(58) Field of Search ................. 361/683–695, 361/724, 727, 728–730, 736, 737, 748; 312/223.1, 223.2, 333; 165/177, 178, 213.1, 214.1, 80.3; 454/184

(56) References Cited

U.S. PATENT DOCUMENTS

| | | | | |
|---|---|---|---|---|
| 5,077,601 A | * | 12/1991 | Hatada et al. | 257/722 |
| 5,168,171 A | * | 12/1992 | Tracewell | 307/64 |
| 5,995,368 A | * | 11/1999 | Lee et al. | 361/695 |
| 6,031,719 A | * | 2/2000 | Schmitt et al. | 361/695 |
| 6,283,850 B1 | * | 9/2001 | Toshimitsu et al. | 454/184 |
| 6,414,845 B2 | * | 7/2002 | Bonet | 361/695 |

OTHER PUBLICATIONS

"PICMG 3.0 Short Form Specification", Jan. 2003, Advanced TCA™, copyright 2003, PCI Industrial Computers Manufacturers Group (PICMG). 34pgs.

Pavlat, Joe "PICMG® 3—Frequently Asked Questions". 6pgs.

* cited by examiner

Primary Examiner—Lynn Feild
Assistant Examiner—Anthony Q. Edwards
(74) Attorney, Agent, or Firm—Buckley, Maschoff & Talwalkar LLC (57) ABSTRACT According to some embodiments, an apparatus includes a chassis to house a plurality of electronic cards, a backplane housed in the chassis, and a fan housed in the chassis. A first portion of the fan may be lower than a top edge of the backplane, and a second portion of the fan may be higher than the top edge of the backplane.

19 Claims, 10 Drawing Sheets

CHASSIS COOLING SYSTEM

BACKGROUND

Computing architectures may utilize a chassis to house electronic components. A chassis may provide protection against environmental hazards as well as a means for sharing systems among the components. For example, a desktop computer chassis may allow several components to share a power supply, a cooling fan, external communications interfaces, and/or other elements.

In another example, a modular server may include several distinct systems, or servers. The servers may be mounted in a chassis, which in turn may provide shared power, cooling, management and/or communications interfaces to the servers. Designers often seek to improve the efficiency of chassis-based architectures in terms of one or more of size, speed, cost, reliability, and other metrics.

DETAILED DESCRIPTION

Figure 1A:
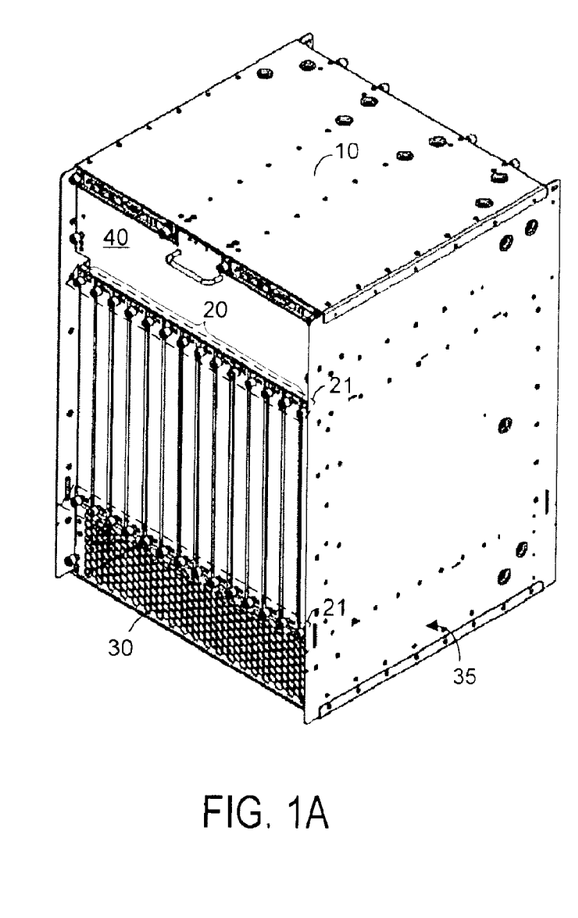
FIG. 1A is a perspective front and side view of a chassis according to some embodiments.

FIG. 1A is a view of chassis 10 according to some embodiments. Chassis 10 may comprise a telecommunications platform or any other type of device. Chassis 10 may be composed of any materials suitable for its intended use, including but not limited to plastic, steel, and aluminum. Physical dimensions of chassis 10 may also vary according to intended uses and/or specifications with which chassis 10 is intended to comply.

Sixteen electronic cards 20 are mounted within chassis 10. Electronic cards 20 are secured to chassis 10 in part by mounting screws 21. Cards 20 may be covered by a faceplate according to some embodiments. Electronic cards 20 may provide any functionality. In some embodiments, one or more of electronic cards 20 may comprise a server or a communications device. All of electronic cards 20 may be identical, or two or more of electronic cards 20 may be different from one another.

Electronic cards 20 may be coupled to one another via a backplane (not shown) that is also housed in chassis 10. In a case that electronic cards 20 each comprise a server, the backplane may distribute power and provide management and data transport functions to electronic cards 20. The arrangement of chassis 10, electronic cards 20, and the backplane may comply with the PCI Industrial Computer Manufacturers Group 3.0 Advanced Telecommunications Computing Architecture specification Rev. 1.0. Other architectures may also be employed in conjunction with some embodiments. Such architectures may be standardized to facilitate the interoperation of devices, chassis and systems of disparate manufacturers.

Chassis 10 includes inlet grate 30 of input plenum 35. According to some embodiments, air is received into inlet grate 30 and input plenum 35 for cooling cards 20. Such air may be sucked into inlet grate 30 and input plenum 35 due to the evacuation of air from inside chassis 10 by one or more fans housed in chassis 10. This process will be described in detail below.

Access door 40 provides access to an output plenum of chassis 10. According to some embodiments, fans may be removed from and replaced in chassis 10 through access door 40. Chassis 10 may also comprise peripheral devices to provide shared functionality among cards 20 during operation. In some embodiments, the peripheral devices comprise one or more of a CD-ROM drive, a floppy disk drive, a keyboard, and a mouse.

Figure 1B:
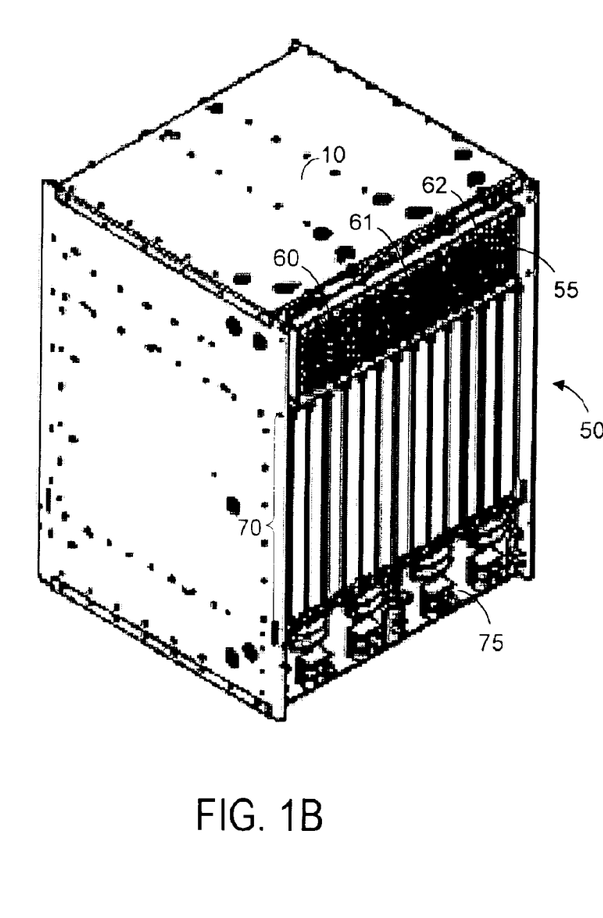
FIG. 1B is a perspective rear and side view of a chassis according to some embodiments.

FIG. 1B is a view of rear panel 50 of chassis 10. Rear panel 50 includes exhaust grate 55. Exhaust grate 55 covers fans 60 through 62, the positions of which are indicated in FIG. 1B. Fans 60 through 62 may be used to draw air out of chassis 10 and to exhaust the air to the external environment.

Rear panel 50 also includes electronic modules 70. Electronic modules 70 may attach to the backplane described above or may comprise portions of one or more of electronic cards 20. Interface elements 75 may also attach to the backplane and may provide and/or directly to one or more of cards 20. Electronic modules 70 and/or interface elements 75 may provide power, management, and I/O connections such as Ethernet and/or Fibre Channel to electronic cards 20.

Figure 2:
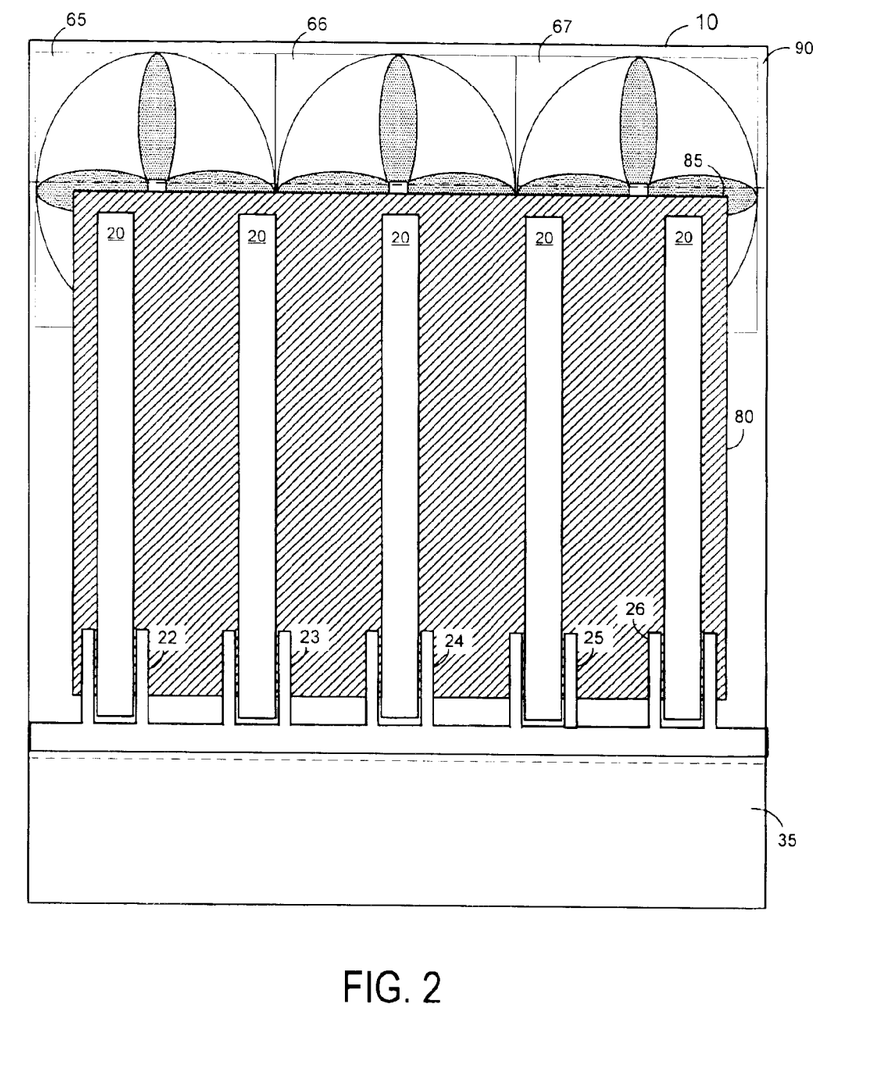
FIG. 2 is a front view of a chassis according to some embodiments.

FIG. 2 is a front cutaway view of chassis 10 according to some embodiments. Five electronic cards 20 are shown supported within respective ones of guide rails 22 through 26, which are in turn supported by their attachment to the side walls of chassis 10. Guide rails 22 through 26 may be components of a subrack that also includes structures for receiving input grate 30 and for supporting backplane 80. Each of cards 20 is also connected to a front side of backplane 80 and physically supported thereby. Other arrangements may be used to support cards 20 according to some embodiments. Any number of cards may be used in some embodiments.

A dotted line indicates that input plenum 35 extends to a bottom surface of guide rails 25 through 29. However, input plenum 35 may be considered to extend anywhere within chassis 10, including but not limited to top edge 85 of backplane 80. Similarly, a dotted line indicates that output plenum 90 extends downward to top edge 85, but may also be considered to extend to any vertical location within chassis 10.

Fans 65 through 67 are disposed within output plenum 90. In the illustrated embodiment, fans 65 through 67 are disposed between fans 60 through 62 and backplane 80, and thereby obscuring fans 60 through 62 in the present view. The positions of fans 65 through 67 will be understood in more detail after the following description of FIG. 4. However, FIG. 2 shows that first portions (not shown) of fans 65 through 67 may be lower than top edge 85 of backplane 80 and second portions of fan 65 through 67 may be higher than top edge 85.

Figure 3:
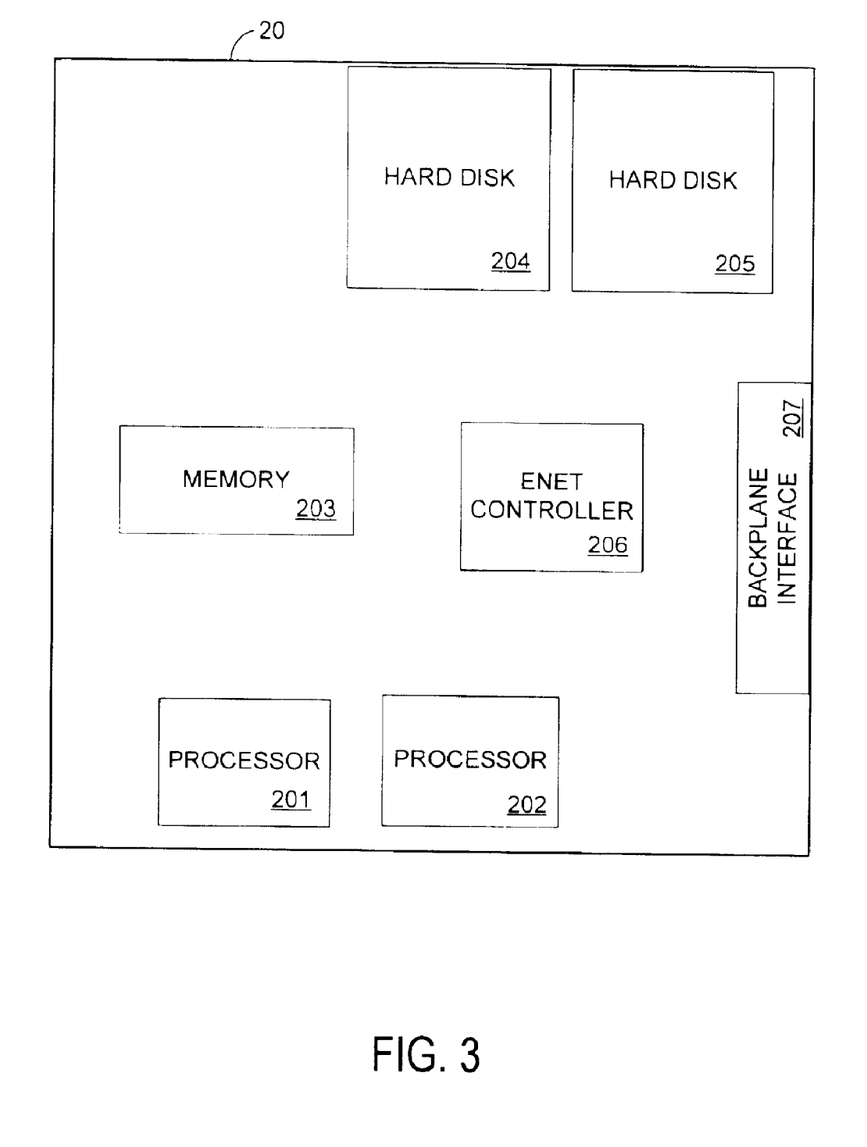
FIG. 3 is a block diagram of a front board according to some embodiments.

FIG. 3 is a block diagram of electronic card 20 according to some embodiments. Electronic card 20 of FIG. 3 comprises a hardware server packaged within a thin enclosure. Embodiments are not limited to such an electronic card.

Electronic card 20 includes processors 201 and 202, such as Intel Xeon™ processors. Processors 201 and 202 are coupled to Double Data Rate Random Access Memory 203. Hard disk drives 204 and 205 may store software applications, data files, device drivers, and an operating system for controlling basic functions of electronic card 20. Ethernet controller 206 allows electronic card 20 to communicate with other devices via Ethernet protocol. Backplane interface 207 may couple card 20 to backplane 80, and may include interfaces for power distribution, card management, and data transfer. As mentioned above, electronic card 20 need not include each element shown, and may include elements other than those shown.

Figure 4:
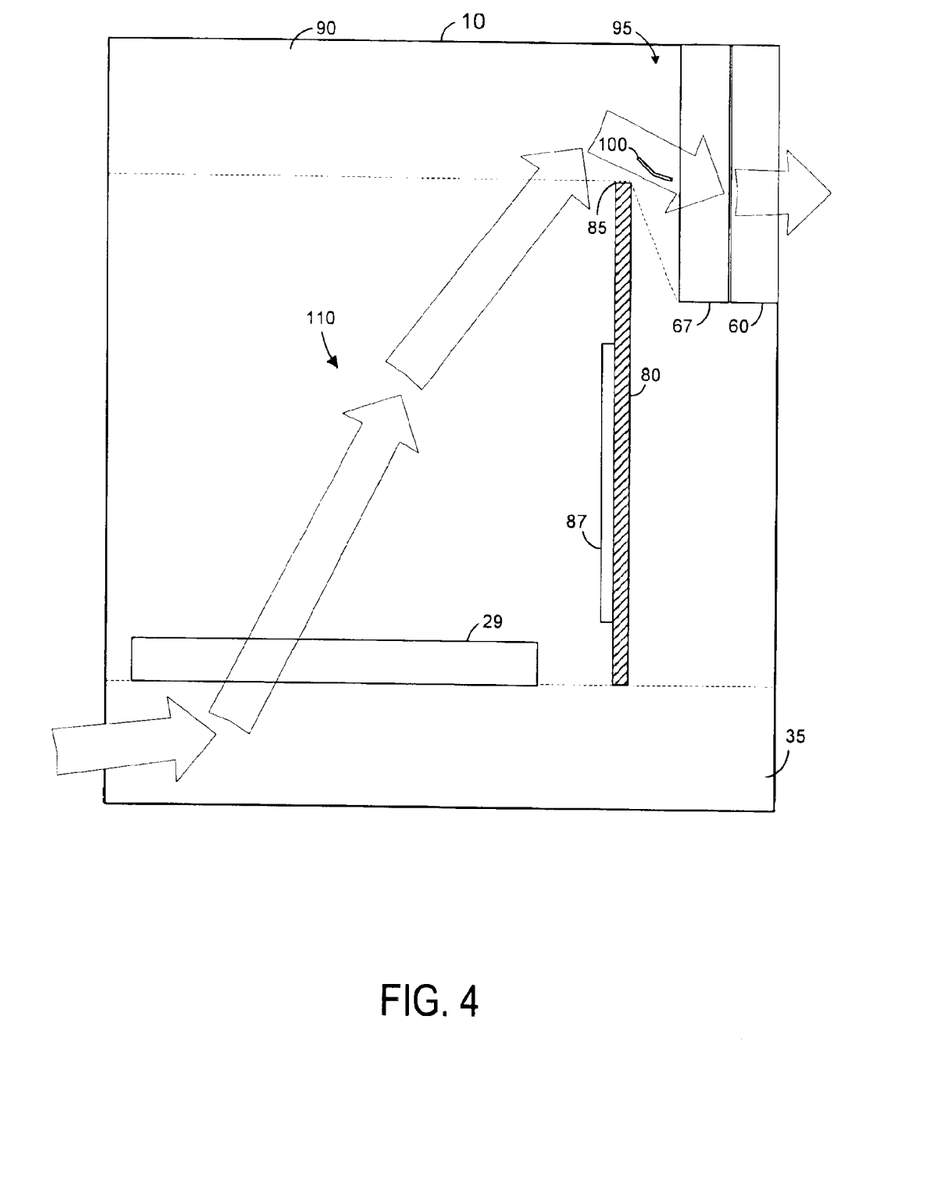
FIG. 4 is a side cutaway view of a chassis according to some embodiments.

FIG. 4 is a cutaway side view of chassis 10 according to some embodiments. Electronic cards 20 have been removed from chassis 10 in the FIG. 4 view. Also in contrast to the FIG. 2 view, FIG. 4 shows connector 87 attached to a front side of backplane 80. Connector 87 allows an electronic card 20 to be received by the front side of backplane 80 and allows the exchange of signals between backplane 80 and the electronic card 20. According to some embodiments, backplane 80 comprises two or more connectors to receive the electronic card 20.

FIG. 4 also shows fan 60 from FIG. 1B. A first portion of fan 67 and a first portion of fan 60 are lower than top edge 85 of backplane 80. Moreover, a second portion of fan 67 and a first portion of fan 60 are higher than top edge 85. Also, a portion of a rear side of backplane 80 is disposed between the first portion of fan 67 and a portion of the front side of backplane 80. A portion of the rear side of backplane 80 is also disposed between the first portion of fan 60 and a portion of the front side of backplane 80.

Some embodiments may provide efficient cooling and allow the use of larger fans for a given height of chassis 10. For example, a height of input plenum 35 may be 2 U (U=1.75"), a height of output plenum may be 2 U, and a remainder of chassis 10 may be 8 U in height. A conventional arrangement may utilize fans having a height of 2 U, while FIG. 4 shows an embodiment in which fans 65 and 60 are greater than 2 U in height. Alternatively, fans 65 and 60 may be as large or larger than conventional fans, but a height one or both of input plenum 35 and output plenum 90 may be less than a conventional height due at least in part to improved cooling provided by some embodiments. In one specific example, a height of each of fans 65 and 60 is 3.5 U, a height of each of input plenum 35 and output plenum 90 is 1 U, and a remaining height of chassis 10 is 8 U.

Output plenum 90 includes output plenum expansion area 95, in which are disposed air diverter 100, fan 67, and fan 60. Air diverter 100 may comprise any currently or hereafter-known element for diverting airflow. More specifically, air 110 is depicted in FIG. 4 as entering input plenum 35 and rising as shown to output plenum 90. Input plenum 35 may comprise an air filter (not shown) to filter air 110 as it enters input plenum 35. Such air may serve to cool electronic cards 20 when they are installed in chassis 10. According to some embodiments, air diverter 100 directs air 110 to enter fan 67 in a more even distribution than would otherwise result from the arrangement of chassis 10. For example, a large majority of air 110 may enter an upper portion of fan 67 in some embodiments if not for the presence of air diverter 100. Air diverter 100 may therefore divert air 110 toward a lower portion of fan 67 that is lower than top edge 85 of backplane 80.

Some embodiments do not include air diverter 100. According to some embodiments, a single air diverter is disposed between backplane 80 and fans 65 through 67. One or more air diverters may also or alternatively be disposed between backplane 80 and each of fans 65 through 67.

Figure 5A:
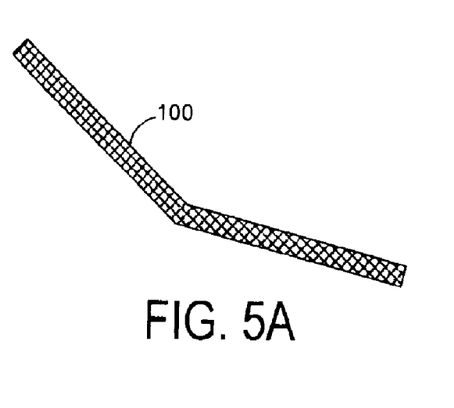
FIG. 5A is a view of an air diverter according to some embodiments.
Figure 5B:
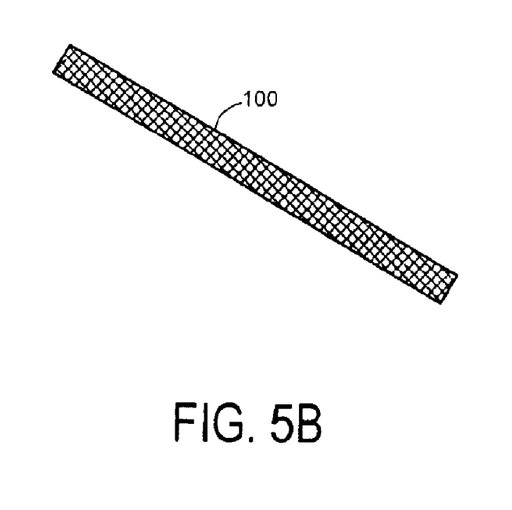
FIG. 5B is a view of an air diverter according to some embodiments.
Figure 5C:
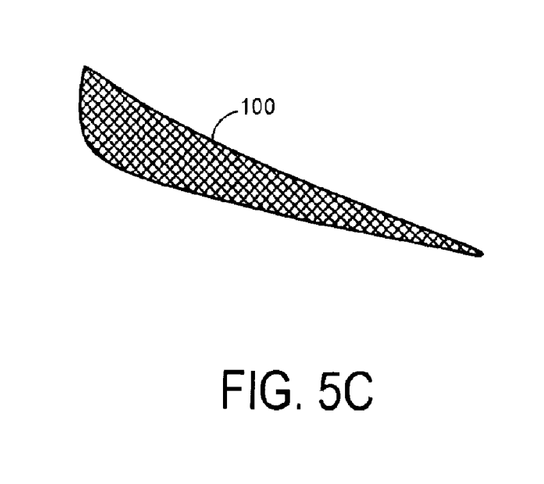
FIG. 5C is a view of an air diverter according to some embodiments.

FIG. 5A is a close-up view of air diverter 100 of FIG. 4. Air diverter 100 may be composed of any suitable material or materials. FIG. 5B shows a design of air diverter 100 that may be easier to fabricate and install than air diverter 100 of FIG. 5A. In contrast, air diverter 100 of FIG. 5C may comprise elements of an airfoil. Air diverter 100 of FIG. 5C may therefore be more difficult to design and fabricate than the other illustrated air diverters. However, air diverter 100 of FIG. 5C may provide for stronger and/or more controllable airflow through fans 67 and 60 and therefore better cooling of chassis 10.

Figure 6:
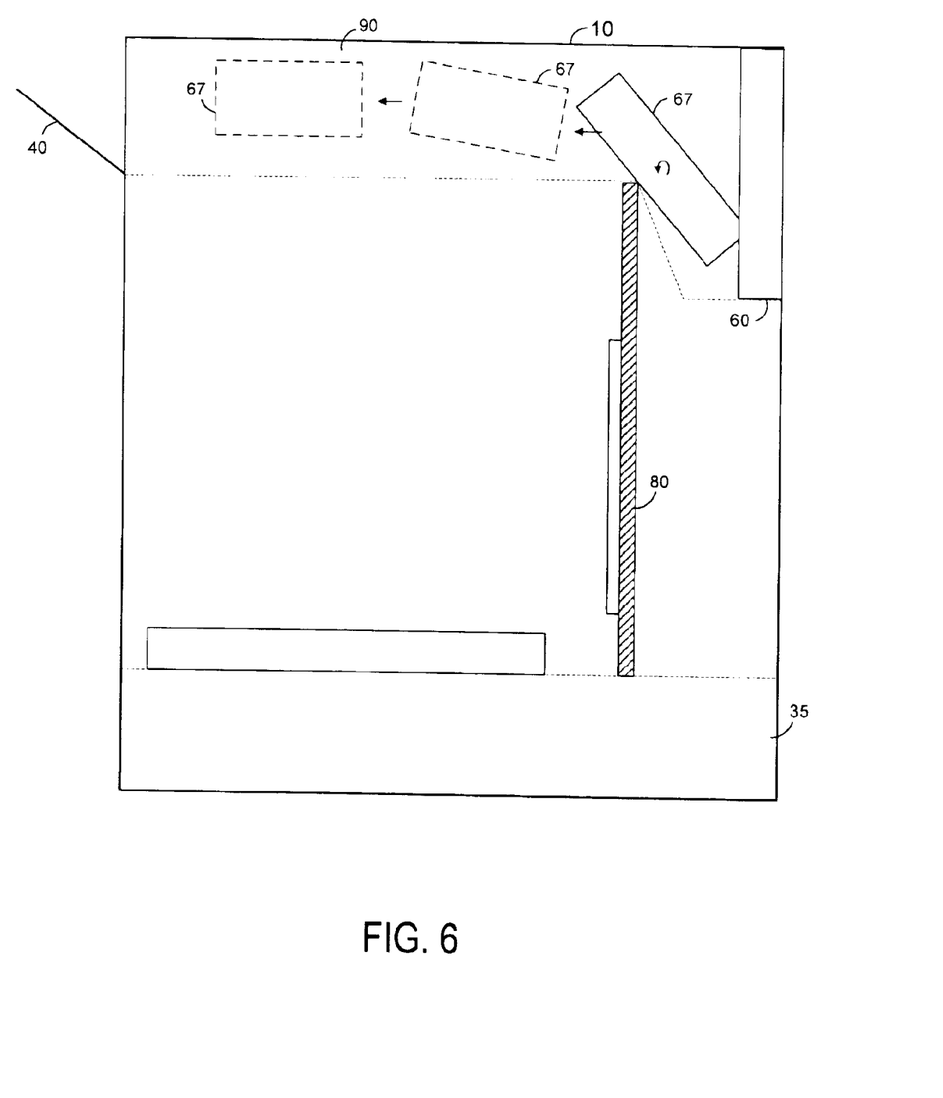
FIG. 6 is a view illustrating rotation and removal of a fan according to some embodiments.

FIG. 6 is a side cutaway view of chassis 10 illustrating the removal of fan 67 according to some embodiments. As shown, fan 67 may be removable from a front side of chassis 10. For example, a technician may open access door 40, reach into output plenum 90, and rotate fan 67 toward the front side of chassis 10. The dotted instances of fan 67 illustrate the removal thereof from the front of chassis 10. Fans 60 through 62, 65, and 66 may be similarly removed from chassis 10 according to some embodiments.

Figure 7:
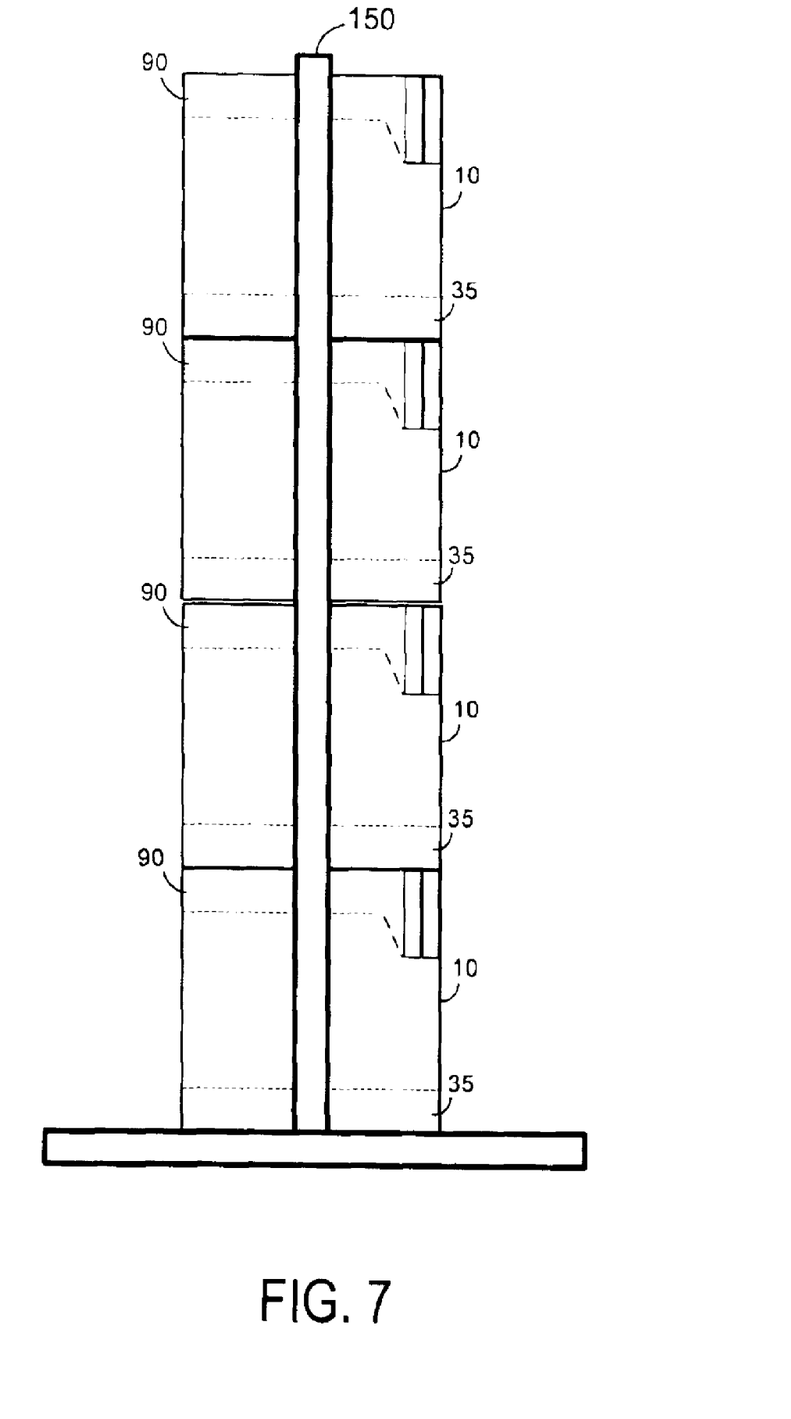
FIG. 7 is a side view of a component rack supporting four chassis according to some embodiments.

FIG. 7 is a view of component rack 150 supporting four instances of chassis 10. Component rack 150 may comply with the Electronic Industries Association (EIA) standard specification 310-D-1992. Component rack 150 may be capable of supporting components having a total height of 42 U. The instances of chassis 10 shown in FIG. 7 include input and output plenums of 1 U in height, for a total height of 10 U per chassis 10. Component rack 150 may therefore support four instances of chassis 10. In contrast, component rack 150 can support only three (or fewer) instances of a chassis having an overall height of 11 U or more.

Figure 8:
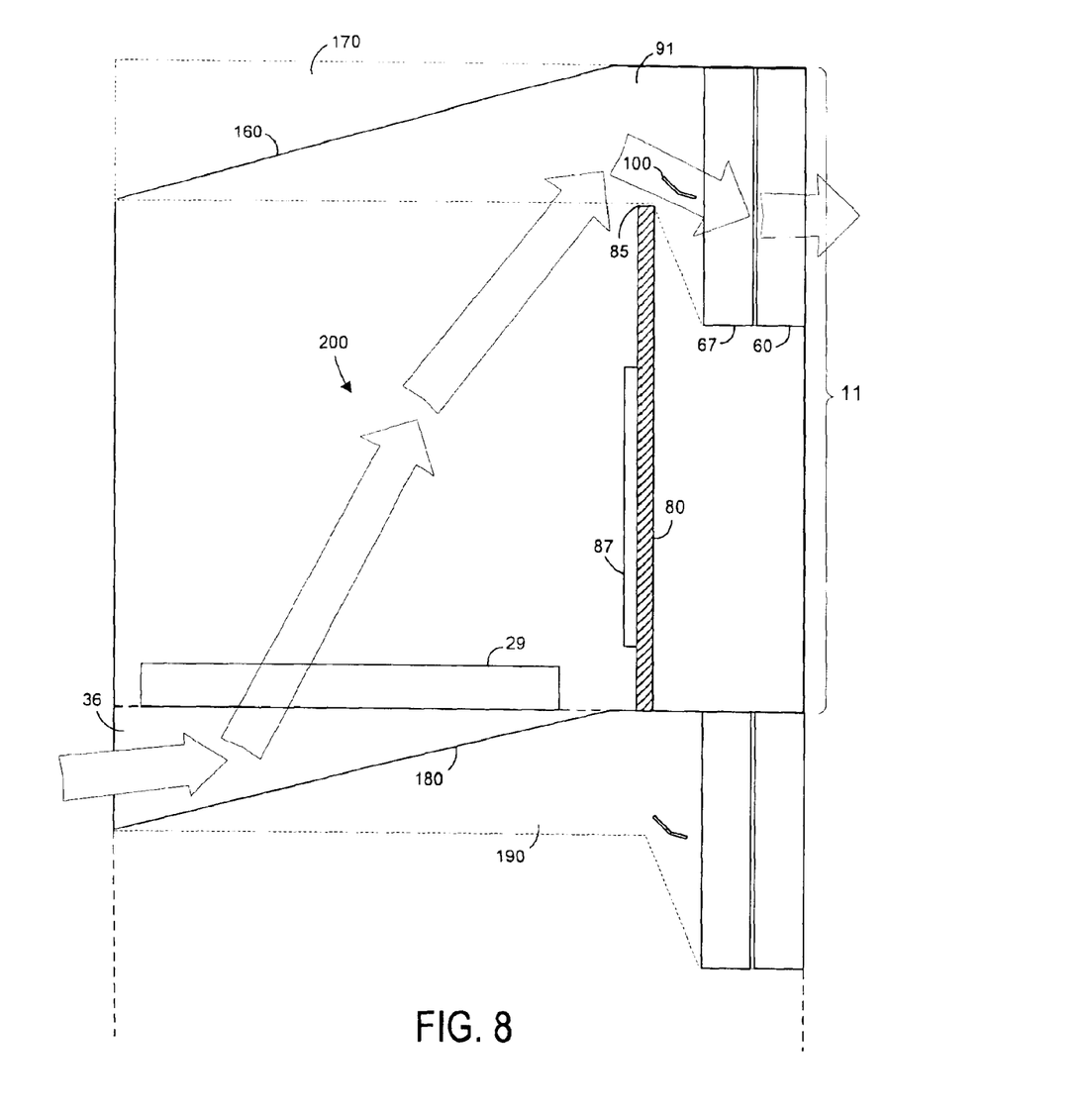
FIG. 8 is a side cutaway view of a chassis according to some embodiments.

FIG. 8 is a side cutaway view of chassis 11 according to some embodiments. The elements of chassis 111 are similar to those described above with respect to chassis 10 with the exception of input plenum 36 and output plenum 91. As shown, a height of input plenum 36 at the front of chassis 11 is greater that a height of input plenum 36 at any location between the front and the rear of chassis 11. In contrast, a height of output plenum 91 at the front of chassis 111 is less than its height at any location between the front and the rear of chassis 11.

Output plenum 91 includes plenum divider 160. Plenum divider 160 comprises an upper surface of output plenum 91 and a lower surface of input plenum 170, which is indicated by a dotted line. Input plenum 170 is an element of a chassis stacked above chassis 11, and is illustrated to show how vertical space may be shared by plenums of two different chassis according to some embodiments. Similarly, plenum divider 180 comprises a lower surface of input plenum 36 and an upper surface of output plenum 190, which is an element of a chassis upon which chassis 11 is stacked. The chassis depicted on top of and below chassis 11 may be identical to or may differ from chassis 11. Moreover, the elements of chassis 11 that are numbered identically to elements of chassis 10 may comprise any of the variations described with respect to the identically-numbered elements.

In some embodiments, air 200 may provide adequate cooling because the shapes of plenums 36 and 91 roughly correspond to the distribution of airflow therein. Plenums 36 and 91 may, according to some embodiments, provide larger effective input and output plenums than conventional horizontally-split plenums having a same total height. Chassis 11 may therefore provide efficient cooling in a smaller vertical form factor than other systems.

According to some embodiments, input plenum 36 has a height of 2 U at the front of chassis 11 and a height of 0 U at the rear of chassis 11, while output plenum 36 has a height of 0 U at the front of chassis 11 and a height of 2 U at the rear of chassis 11. Such embodiments may effectively provide the cooling of a conventional system having a 2 U input plenum and a 2 U output plenum while adding only 2 U, rather than 4 U, to a chassis height.

Figure 9:
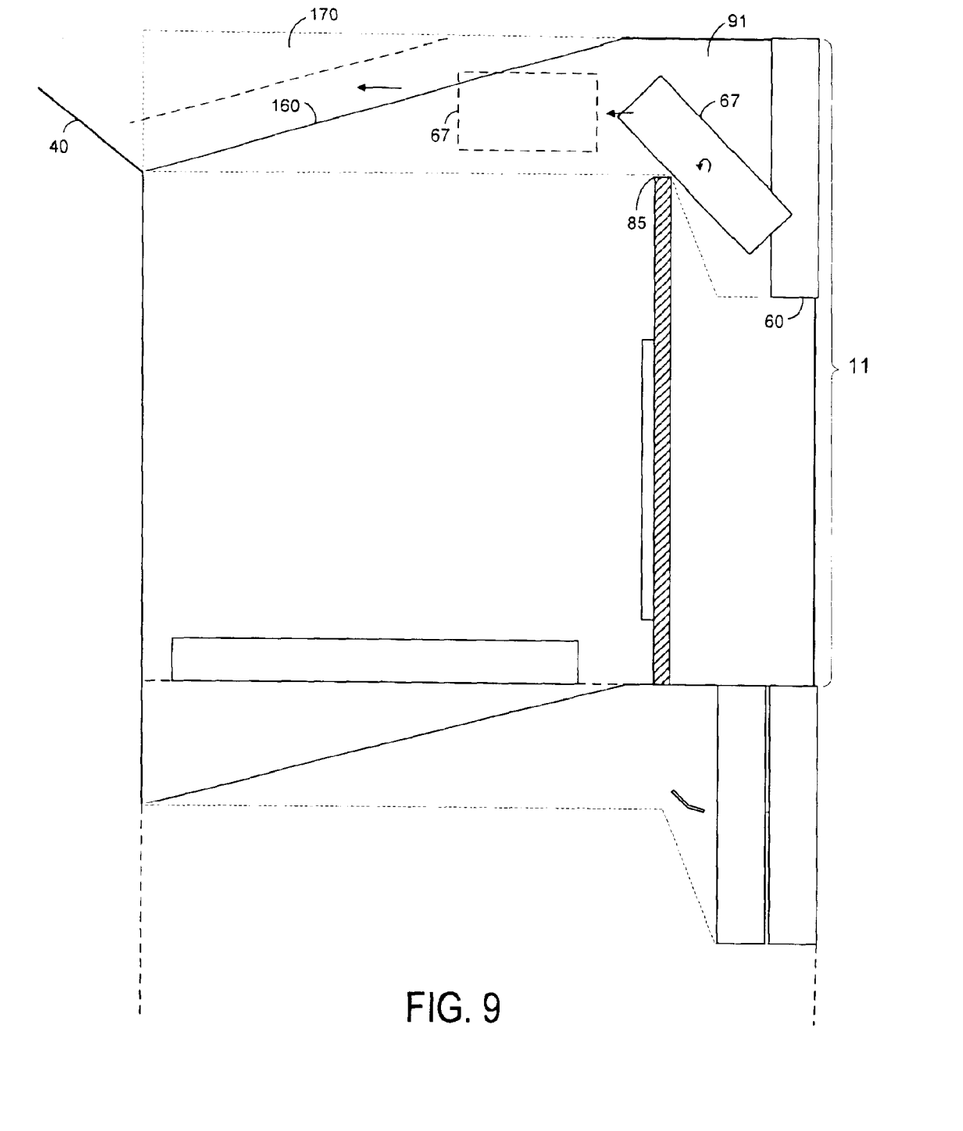
FIG. 9 is a view illustrating rotation and removal of a fan according to some embodiments.

FIG. 9 is a side cutaway view of chassis 11 illustrating the removal of fan 67 according to some embodiments. Removal of fan 67 may require removal of plenum divider 160, which may comprise a baffle that separates output plenum 91 from input plenum 170. Similar to the procedure described above, a technician may open access door 40, remove plenum divider 160, rotate fan 67 toward the front side of chassis 11, and remove fan 67 therefrom. Fan 60 may then be removed from chassis 11 according to some embodiments.

Figure 10:
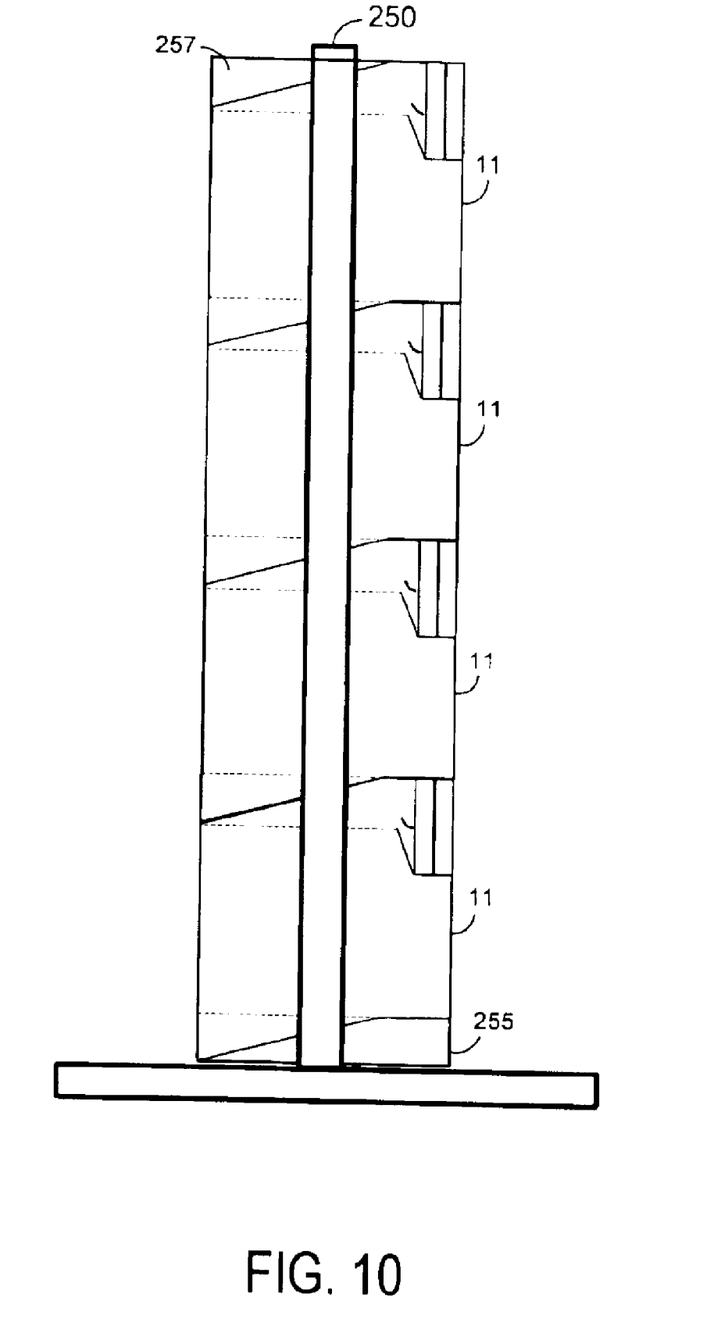
FIG. 10 is a side view of a component rack supporting four chassis according to some embodiments.

FIG. 10 is a view of component rack 250 and four instances of chassis 11. Base 255 supports the lowest one of chassis 11 so that the components of each chassis are correctly oriented. Base 255 also comprises an input plenum for the lowest instance of chassis 11 and may provide support for an air filter. Upper enclosure 257 may be coupled to an uppermost instance of chassis 11 because the area occupied by enclosure 257 is not being used as an input plenum by another chassis.

Component rack 250 may be a standard component rack for supporting components having a total height of 42 U. The input and output plenums of each chassis 11 may be 1 U in maximum height and the remaining height of each chassis may be 8 U, for a total height of 10 U per chassis 11. Component rack 250 may therefore support four instances of chassis 11.

The several embodiments described herein are solely for the purpose of illustration. Embodiments may include any currently or hereafter-known versions of the elements described herein. Therefore, persons skilled in the art will recognize from this description that other embodiments may be practiced with various modifications and alterations.

What is claimed is:

1. An apparatus comprising:
   a chassis to house a plurality of electronic cards;
   a backplane housed in the chassis;
   a fan housed in the chassis, a first portion of the fan being lower than a top edge of the backplane; and
   an air diverter to divert air toward the first portion of the fan,
   wherein a second portion of the fan is higher than the top edge of the backplane, and
   wherein a first portion of the air diverter is higher than the top edge of the backplane.

2. An apparatus according to claim 1, the backplane comprising:
   a front side to receive the plurality of electronic cards; and
   a rear side,
   wherein a portion of the rear side of the backplane is disposed between the first portion of the fan and a portion of the front side of the backplane.

3. An apparatus according to claim 1, further comprising:
   a second fan housed in the chassis,
   wherein the second fan is disposed between the fan and the backplane.

4. An apparatus according to claim 3, wherein a first portion of the second fan is lower then the top edge of the backplane, and
   wherein a second portion of the second fan is higher than the top edge of the backplane.

5. An apparatus according to claim 1, wherein the air diverter comprises an airfoil.

6. An apparatus according to claim 1, the chassis further comprising:
   an input plenum having a first height at a front of the chassis and a second height at a location between the front of the chassis and a rear of the chassis, the first height being greater than the second height; and
   an output plenum having a third height at the rear of the chassis and a fourth height at a location between the rear of the chassis and the front of the chassis, the third height being greater than the fourth height,
   wherein the fan is disposed in the output plenum.

7. An apparatus according to claim 6, wherein the input plenum comprises a lower surface, and further comprising:
   a second chassis to house a second plurality of electronic cards, the second chassis comprising:
   a second output plenum comprising a plenum divider and having a fifth height at a rear of the second chassis and a sixth height at a location between the rear of the second chassis and a front of the second chassis, the fifth height being greater than the sixth height,
   wherein the plenum divider of the second output plenum comprises the lower surface of the input plenum.

8. An apparatus according to claim 7, further comprising:
   a second backplane housed in the second chassis; and
   a second fan disposed in the second output plenum, a first portion of the second fan being lower than a top edge of the second backplane; and
   a second air diverter to divert air toward the first portion of the second fan,
   wherein a second portion of the second fan is higher than the top edge of the second backplane, and
   wherein a first portion of the second air diverter is higher than the top edge of the second backplane.

9. An apparatus according to claim 6, wherein the output plenum comprises a plenum divider, and further comprising:
   a second chassis to house a second plurality of electronic cards, the second chassis comprising:
   a second input plenum comprising an lower surface and having a fifth height at a front of the second chassis and a sixth height at a location between a rear of the second chassis and the front of the second chassis, the fifth height being greater than the sixth height,
   wherein the plenum divider of the output plenum comprises the lower surface of the second input plenum.

10. An apparatus according to claim 9, further comprising:
- a second backplane housed in the second chassis; and
- a second fan housed in the second chassis, a first portion of the second fan being lower than a top edge of the second backplane; and
- a second air diverter to divert air toward the first portion of the second fan,
- wherein a second portion of the second fan is higher than the top edge of the second backplane, and
- wherein a first portion of the second air diverter is higher than the top edge of the second backplane.

11. An apparatus according to claim 1, wherein the fan is removable from a front of the chassis.

12. An apparatus according to claim 11, wherein the fan is rotatable towards the front of the chassis.

13. A system comprising:
- a chassis to house a plurality of electronic cards;
- a backplane housed in the chassis;
- an Ethernet interface coupled to the backplane; and
- a fan housed in the chassis, a first portion of the fan being lower than a top edge of the backplane; and
- an air diverter to divert air toward the first portion of the fan,
- wherein a second portion of the fan is higher than the top edge of the backplane, and
- wherein a first portion of the air diverter is higher than the top edge of the backplane.

14. A system according to claim 13, the backplane comprising:
- a front side to receive the plurality of electronic cards; and
- a rear side,
- wherein a portion of the rear side of the backplane is disposed between the first portion of the fan and a portion of the front side of the backplane.

15. A system according to claim 13, the chassis further comprising:
- an input plenum having a first height at a front of the chassis and a second height at a location between the front of the chassis and a rear of the chassis, the first height being greater than the second height; and
- an output plenum having a third height at the rear of the chassis and a fourth height at a location between the rear of the chassis and the front of the chassis, the third height being greater than the fourth height,
- wherein the fan is disposed in the output plenum.

16. A system according to claim 15, wherein the input plenum comprises a lower surface, and further comprising:
- a second chassis to house a second plurality of electronic cards, the second chassis comprising:
- a second output plenum comprising a plenum divider and having a fifth height at a rear of the second chassis and a sixth height at a location between the rear of the second chassis and a front of the second chassis, the fifth height being greater than the sixth height,
- wherein the plenum divider of the second output plenum comprises the lower surface of the input plenum.

17. A system comprising:
- four electronic card chassis, the four electronic card chassis comprising respective ones of:
- a backplane; and
- a fan housed in the chassis, a first portion of the fan being lower than a top edge of the backplane; and
- an air diverter to divert air toward the first portion of the fan,
- wherein a second portion of the fan is higher than the top edge of the backplane, and wherein a first portion of the air diverter is higher than the top edge of the backplane; and
- a component rack to support the four electronic card chassis.

18. A system according to claim 17, wherein the component rack is to support components having a total height of 42 U or less, and wherein a height of at least one of the four electronic card chassis is less than 11 U.

19. A system according to claim 17, at least one of the electronic card chassis comprising:
- an input plenum having a first height at a front of the at least one electronic card chassis and a second height at a location between the front of the at least one electronic card chassis and a rear of the at least one electronic card chassis, the first height being greater than the second height; and
- an output plenum having a third height at the rear of the at least one electronic card chassis and a fourth height at a location between the rear of the at least one electronic card chassis and the front of the at least one electronic card chassis, the third height being greater than the fourth height,
- wherein the fan is disposed in the output plenum.

* * * * *